(12) United States Patent
Urban et al.

(10) Patent No.: US 8,212,417 B2
(45) Date of Patent: Jul. 3, 2012

(54) HIGH-VOLTAGE SWITCH HAVING PARALLEL SPARK GAPS EACH WITH A SERIALLY CONNECTED FUSE AND USE THEREOF FOR A MICROWAVE GENERATOR

(75) Inventors: Jürgen Urban, Erlangen (DE); Geoffrey Staines, San Diego, CA (US)

(73) Assignee: Diehl BGT Defence GmbH & Co., KG, Überlingen (DE)

( * ) Notice: Subject to any disclaimer, the term of this patent is extended or adjusted under 35 U.S.C. 154(b) by 1059 days.

(21) Appl. No.: 11/632,797

(22) PCT Filed: Jul. 8, 2005

(86) PCT No.: PCT/EP2005/007426
§ 371 (c)(1), (2), (4) Date: Jun. 9, 2008

(87) PCT Pub. No.: WO2006/008000
PCT Pub. Date: Jan. 26, 2006

(65) Prior Publication Data
US 2009/0015159 A1  Jan. 15, 2009

(30) Foreign Application Priority Data
Jul. 19, 2004  (DE) .......................... 10 2004 034 895

(51) Int. Cl.
*H01T 1/00* (2006.01)
*H01T 2/02* (2006.01)

(52) U.S. Cl. ...................................... 307/106

(58) Field of Classification Search .................. 307/106, 307/107, 108, 109, 110; 361/249, 250
See application file for complete search history.

(56) References Cited

U.S. PATENT DOCUMENTS

| | | | | |
|---|---|---|---|---|
| 2,832,265 A | * | 4/1958 | Reid et al. | 361/250 |
| 2,844,740 A | * | 7/1958 | Schofield | 307/109 |
| 3,398,322 A | | 8/1968 | Guenther | |
| 4,198,590 A | | 4/1980 | Harris | |
| 4,267,484 A | * | 5/1981 | O'Loughlin | 313/325 |
| 5,489,818 A | | 2/1996 | Naff et al. | |
| 7,375,444 B2 | * | 5/2008 | Staines et al. | 307/100 |

FOREIGN PATENT DOCUMENTS

| | | |
|---|---|---|
| DE | 35 87 679 T2 | 4/1994 |
| DE | 45 35 329 A1 | 4/1994 |
| DE | 103 13 045 B3 | 7/2004 |
| WO | WO 2006/008000 A1 | 1/2006 |

OTHER PUBLICATIONS

Machine translation of DE10313045 (description and claims).*

* cited by examiner

*Primary Examiner* — Fritz M Fleming
(74) *Attorney, Agent, or Firm* — Scully, Scott, Murphy & Presser, P.C.

(57) ABSTRACT

High-voltage switch, in particular for a microwave generator, which includes a spark gap which breaks down in order to switch when a high voltage is applied provided is a plurality of parallel-connected spark gaps (12, 12a, 12b), each having at least one electrode (13, 13a, 13b) with a series-connected fuse (14, 14a, 14b) which is irreversibly destroyed when the respective spark gap (12, 12a, 12b) breaks down.

13 Claims, 2 Drawing Sheets

HIGH-VOLTAGE SWITCH HAVING PARALLEL SPARK GAPS EACH WITH A SERIALLY CONNECTED FUSE AND USE THEREOF FOR A MICROWAVE GENERATOR

BACKGROUND OF THE INVENTION

1. Field of the Invention

The invention relates to a high-voltage switch, in particular for a microwave generator, which includes a high-voltage source and a plurality of spark gaps each having two electrodes. A fuse is connected in series with each spark gap, and these series circuits are connected to each other in a parallel circuit.

High-voltage switches of the type mentioned initially are used in many fields of application, in which high voltages have to be switched, across which a capacitor structure, which is charged via the applied high voltage, can be discharged. When the charging voltage reaches the breakdown voltage of the spark gap, whose withstand voltage is in the end dependent on the dielectric that is used, then this results in the striking of the arc, the spark gap becomes conductive, and the capacitively stored energy can be discharged.

By way of example, a microwave generator is one application example in which a high pulse energy high-voltage pulse is intended to be switched. The operation of a generator such as this is based on a high-voltage source, for example a capacitor bank which is charged in parallel on the basis of the Marx surge-voltage circuit principle and is then connected in series, is discharged across the spark gap of the high-voltage switch. A pulse discharge process such as this leads to a rapidly rising and highly oscillating current flow, and thus to a correspondingly broadband radiated emission of a microwave spectrum with such a high energy density that radio traffic can be at least adversely affected in the vicinity of a microwave generator such as this, and, in particular, the input side of an electronic circuit can be interfered with or even destroyed.

A high-voltage generator powered by explosive can also be used as a high-voltage source and, in comparison with conventional high-voltage generators, can provide a single high-voltage pulse with an extremely high pulse energy. The output pulse which can be produced by an explosive-powered generator such as this is able, for example, to charge a capacitance of 2 nF to a voltage of 1 MW, which corresponds to a pulse energy of 1 kJ.

2. Discussion of the Prior Art

Capacitor structures, such as those which are used in the microwave generators of the type described are, however, not able to temporarily store such high energies and to emit them as a high-power microwave pulse. It would admittedly be possible to increase the capacitor capacitance, and thus the capacitance of the transmitting antenna. However, this leads to a change in the resonance behavior of the structure, the resonant frequency falls, in which case the antennas required must at the same time be designed to be very large for effective radiated emission, and this is undesirable. A further limiting factor is the withstand voltage of the spark gap of the high-voltage switch, which shorts the pulse-forming line of the resonator antenna in the microwave generator. Either spark gaps with a gaseous or a liquid dielectric are used in this case, with the triggering electrodes being positioned at a distance of about 2 mm from one another, in order to achieve switching-on losses that are as low as possible. The withstand voltage could admittedly be increased by increasing the separation, but this would result in an increase in the losses, without the effective radiated microwave field being increased. Spark gaps with a solid dielectric are known as an alternative to the use of liquid or gaseous dielectrics. These have a considerably higher breakdown voltage than dielectric liquids or high-pressure gases, that is to say the withstand voltage can be increased considerably, up to 1.5-2 MV. When they break down, solid spark gaps such as these have a very high current rate of rise, and thus low switching-on losses associated with this. However, they have the disadvantage that the solid dielectric is destroyed when it breaks down, and self-healing is impossible—in contrast to the situation with liquid or gaseous dielectrics. In consequence, solid dielectric switches such as these can be used only for a single discharge, and thus to emit only one pulse. Although solid dielectric switches such as these allow the withstand voltage of the spark gap to be increased into the MV range, it is nevertheless impossible, for the reasons described above, to effectively use the extremely high pulse energy which is provided, for example, by an explosive-powered high-voltage generator.

DE 103 13 045 B3 discloses a switching apparatus which is intended to trip in response to an overvoltage. This known switching apparatus has spark gaps which each have two electrodes, which are connected in parallel and are provided in each parallel part with a fuse connected in series with the spark gap. The respective fuse is irreversibly destroyed when a breakdown occurs across the spark gap. The respective spark gap may have a gaseous dielectric.

U.S. Pat. No. 5,489,818 describes a compact high-energy microwave generator. This known microwave generator has a cavity resonator which has two opposite electrodes which are shorted very quickly in order to produce a high-energy microwave pulse. The cavity resonator contains a liquid dielectric.

U.S. Pat. No. 3,398,322 discloses a high-voltage switch which has a gap in which a gaseous dielectric is located, such as air, nitrogen or sulfur hexafluoride, or a liquid dielectric, such as a dielectric oil, or a solid dielectric, such as polyethylene or Mylar.

DE 35 87 679 T2 discloses a fuse with a fuse element which extends between two connections in a housing and has at least two parallel-connected conductors, and at least one core composed of insulation material. In this case, one conductor may be a glass fiber, and one conductor may be a copper wire. By way of example, the copper wire may have a diameter of 25 μm or 50 μm. The diameter of the respective copper wire and the combination of copper wires to the glass fibers depends on the rated current of the fuse and on the desired response behavior of the fuse.

SUMMARY OF THE INVENTION

The invention is based on the object of providing a spark-gap high-voltage switch of the type mentioned initially, which can be used wherever high energy levels are intended to be switched, in particular but not restrictively and in conjunction with a microwave generator.

The parallel-connected spark gaps allow multiple discharge of the capacitance and thus splitting of the total energy emitted from the single-pulse high-voltage source, into a plurality of pulses. When the gap-specific breakdown voltage is reached, the "weakest" spark gap of the plurality of parallel-connected spark gaps will trigger first of all, leading to a first partial discharge. The fuse which is connected in series with the respective spark gap and is irreversibly destroyed on breakdown prevents the possibility of another breakdown across this spark gap if the capacitance of the pulsed line is charged further, which would result in a considerably lower voltage, because the withstand voltage no longer corresponds to the original as a result of the immediately preceding triggering. In fact, it is possible to charge the respective capacitance until the holding voltage reaches the withstand voltage of the "next-weaker" spark gap, so that this is triggered, although it is thus immediately decoupled again because the fuse blows on triggering. This makes it possible to provide a discharge, effectively in the form of a cascade, in the form of a plurality of pulse elements so that the large amount of energy provided by the voltage source can effectively be used in the form of a plurality of individual pulses.

Each spark gap in the high-voltage switch according to the invention may contain a liquid or gaseous medium as the dielectric. Although dielectrics such as these have a self-healing behavior, the self-healing process is, however, a relatively slow process, in comparison to the rate of charging of the capacitor structure. This means that the ionized channel produced during the previous breakdown has not yet been completely dissipated through the dielectric when the charging voltage once again reaches the withstand voltage, which is reduced as before as a result of the residual ionization, of the spark gap which has already been triggered. This would thus lead to a considerably earlier, uncontrolled second breakdown. However, the irreversibly destroyed fuse means that this is no longer possible, although breakdown is possible across one of the parallel spark gaps. The second discharge process can thus be carried out considerably more quickly than would be possible with spark gaps having liquid or gaseous dielectrics without the use of the fuse according to the invention.

As an alternative to the use of dielectrics such as these, the spark gap may, of course, also at least partially be composed of a solid dielectric, for example an epoxy resin. In order to provide discrete, defined discharge parts, it is expedient for each spark gap to be formed by means of two discrete electrodes, which means that each electrode that is protected by the fuse is opposite a second discrete electrode.

From the manufacturing point of view, it is expedient to provide an isolator mount having a plurality of channels which are isolated from one another and in each of which at least the first electrode, preferably both electrodes and the fuse, are accommodated. This isolator mount which, for example when using a solid dielectric composed of the same material, may if required be manufactured integrally with the channel-side dielectrics, has a plurality of discrete channels which contain the spark gap and/or define it. At least the first electrode is held in the channels in each case. The isolator mount expediently extends between the capacitor surfaces between which the breakdown is intended to take place, so that all of the electrodes as well as the fuses are preferably accommodated in the channels, with the respective channels preferably being isolated from one another over the entire length.

By way of example, a wire fuse, in particular a copper wire, may be used as the fuse, and preferably has a diameter of $\leq 100$ μm, in particular between 5 μm and 25 μm, and a length of $\leq 15$ cm, in particular between 5 cm and 10 cm. As a result of the fact that only a single voltage pulse is passed via the fuse and a very short discharge current flows, it is possible to use a wire that is as thin as this. The fuse must be designed such that its blowing is correlated approximately with the desired discharge process.

As described, the high-voltage switch according to the invention allows the voltage-dependent breakdown times to be cascaded. These different breakdown times may result from manufacturing tolerances, since the spark gaps naturally cannot all be designed to have absolutely identical withstand voltages. In this situation, the triggering sequence would in the end therefore be random. In order to allow the triggering sequence—and thus the respective gap-specific withstand voltages as well, of course—to be set in a defined manner, one development of the invention provides, in order to cascade the breakdown times, for the distances between the electrodes of the respective spark gaps to be different have all, when using solid dielectrics, for the thickness of the dielectrics to be designed to be different in the area between the electrodes. This refinement of the invention thus results in a design influence on the triggering process.

The spark gaps themselves may be arranged in the form of a row or ring depending on how the capacitor arrangement is itself designed.

The high-voltage switch according to the invention can preferably be used for a microwave generator which has at least one charge store which is connected in series with an associated high-voltage switch, in which case the charge store can be discharged via the respective high-voltage switch in order to emit microwaves.

-BRIEF DESCRIPTION OF THE DRAWINGS

Further details of the invention will become evident from the exemplary embodiments described in the following text and from the drawings, which.

-DETAILED DESCRIPTION OF THE INVENTION

Figure 1:
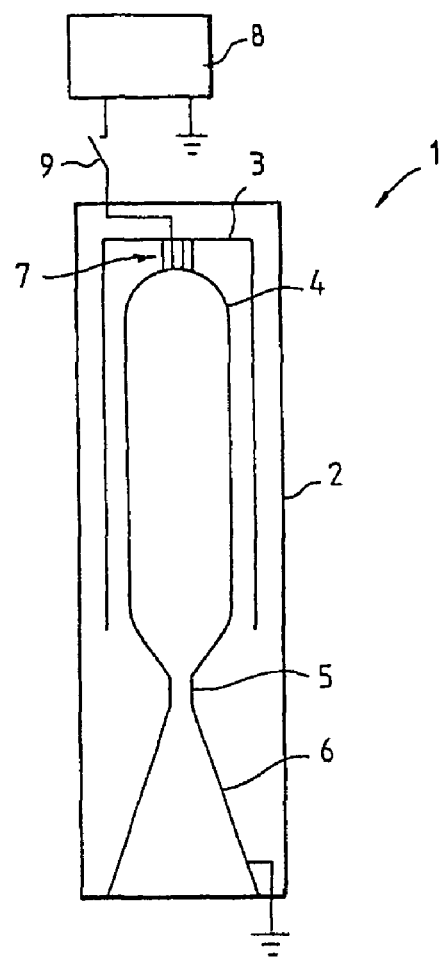
FIG. 1 shows an outline sketch of a microwave generator according to the invention.

As a non-limiting outline illustration, FIG. 1 shows a microwave generator 1 according to the invention, comprising a hollow-cylindrical housing 2 composed of an electrically insulating material. Two electrodes 3, 4 are provided in this housing 2, with the electrode 3 being essentially pot-like and cylindrical, while the electrode 4 is in the form of a hollow spherical cap. To a certain extent, the electrode 4 represents the bulging-out bottom of an otherwise bulbous bottle-shaped electrode within the pot-shaped electrode surrounding it. The taper 5, which is in the form of a bottleneck, is adjacent to the narrow base of the hollow truncated-conical antenna element 6 with an acute angle, which, because of its funnel shape, at the same time acts as an impedance converter for the emission behavior of the high-frequency mixture, when the two electrodes 3, 4 are shorted for the discharge via the high-voltage switch 7. The entire arrangement is rotationally symmetrical. The electrodes 3, 4 form a capacitive structure and thus a charge store, which can be charged via a high-voltage source 8. The high-voltage source 8, which may, for example, be an explosive-powered high-voltage generator is connected via a switch 9 to the electrode 3, which is charged when the switch 9 is closed. When the charging voltage reaches the withstand voltage of a spark gap which is provided in the high-voltage switch 7, when this spark gap breaks down, thus resulting in triggering and thus short-circuiting of the electrodes 3, 4, as a result of which powerful oscillating short-circuit currents oscillate as a result of the discharge process of the charge door, that is to say of the electrode 3, and the antenna element 6, that is to say the antenna, emits a microwave pulse.

Figure 2:
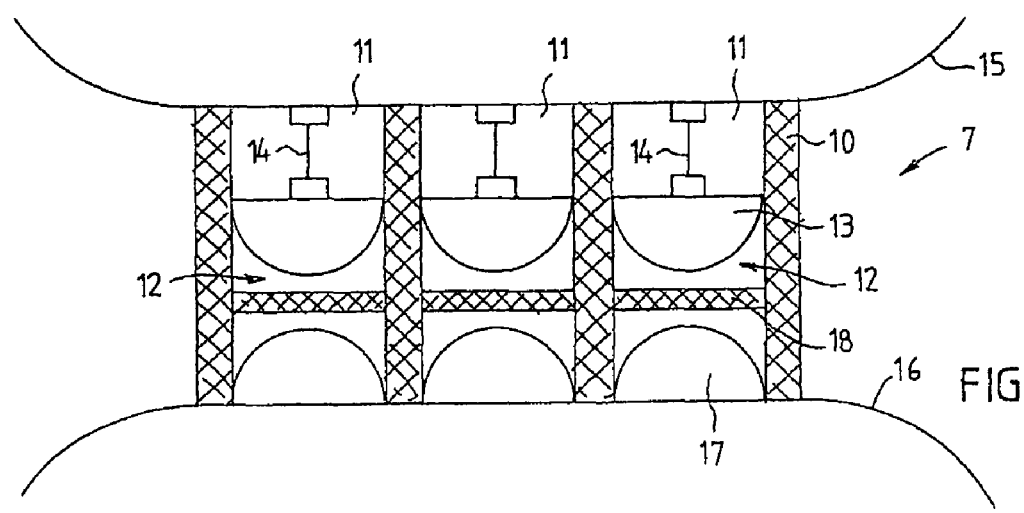
FIG. 2 shows an outline sketch of a high-voltage switch according to the invention, as can be used for the microwave generator shown in FIG. 1.

Since the high-voltage source 8, in particular in the form of an explosion-powered generator, has considerably more available energy than can be emitted via the antenna element 6, a high-voltage switch 7 designed according to the invention is used, as is shown by way of example in FIG. 2. The high-voltage switch 7 shown there has an isolator mount 10 in which a plurality of channels 11 are provided, in which the spark gaps 12 are formed. A first electrode 13 is provided in each channel 11 and is coupled via a fuse 14 in the form of a wire to an electrode 15, for example to the electrode 3 in FIG. 1. The hemispherical electrode 13 is in each case positioned opposite a second, likewise hemispherical, electrode 17, on an opposing electrode 16 which, for example, corresponds to the electrode 4 in FIG. 1. The spark gap 12 is located between the two of them, and is filled with the dielectric. A solid dielectric 18 is provided for the embodiment shown in FIG. 2, and, for example, can be manufactured integrally with the dielectric mount 10 and from the same material, for example epoxy resin. The rest of the space in the respective channel 11 can be filled, for example, with an insulating gas.

The withstand voltage of each spark gap 12 is governed by the withstand voltage of the respective dielectric 18. With the electrode 15 or, on the basis of FIG. 1, the electrode 3 is now charged, when the electrodes 13 are charged at the same time. A potential difference is formed between these electrodes 13 and the second, opposite electrodes 17, which are grounded. When the charging voltage reaches the breakdown voltage of that spark gap 12 which has the lowest withstand voltage, then this spark gap will trigger first of all. On the basis of FIG. 2, it is assumed that the spark gap 12 shown on the left in this figure is the "weakest" spark gap due, for example, to manufacturing tolerances, or can be set deliberately by appropriate variation of the distance between the electrodes 13 and 17 across the respective spark gaps, or by variation of the diameter of the solid dielectric 18. When breakdown occurs, an arc is struck between the two electrodes 13 and 17 of the left-hand spark gap 12 resulting in discharging of the capacitor structure, and thus in a powerful short-circuit current being introduced into the electrode 16, which is coupled to the microwave antenna element, which then emits the microwaves.

The fuse 14 is irreversibly destroyed during the breakdown, that is to say the fuse wire is broken, and the electrode 13 is thus no longer coupled to the electrode 15. The other spark gaps 12 remain undamaged, since they have not been triggered. When the capacitance is charged further, formed via the pulse-shaping line which is connected to the electrode 15, the spark gap 12 which has already been triggered can no longer be initiated because its fuse 14 has been destroyed. However, a second breakdown is possible across one of the remaining spark gaps 12, to be precise across that which has the next-higher withstand voltage. If, in the illustrated exemplary embodiment, the central spark gap 12 now breaks down, this also results in a discharge of the capacitance and in the emission of a microwave pulse, but the fuse 14 is in this case also irreversibly destroyed at the same time here. On further charging, a further breakdown can then occur across the third spark gap 12, although, of course, considerably more than the three spark gaps that are shown may be provided.

The use of the switch according to the invention thus results in multiple charging and discharging of the capacitance and in the emission of a plurality of microwave pulses, that is to say a single high-energy output pulse from a single-pulse high-voltage source is broken down into a plurality of pulse elements, which can be achieved solely by means of the switching behavior of the high-voltage switch 7.

Figure 3:
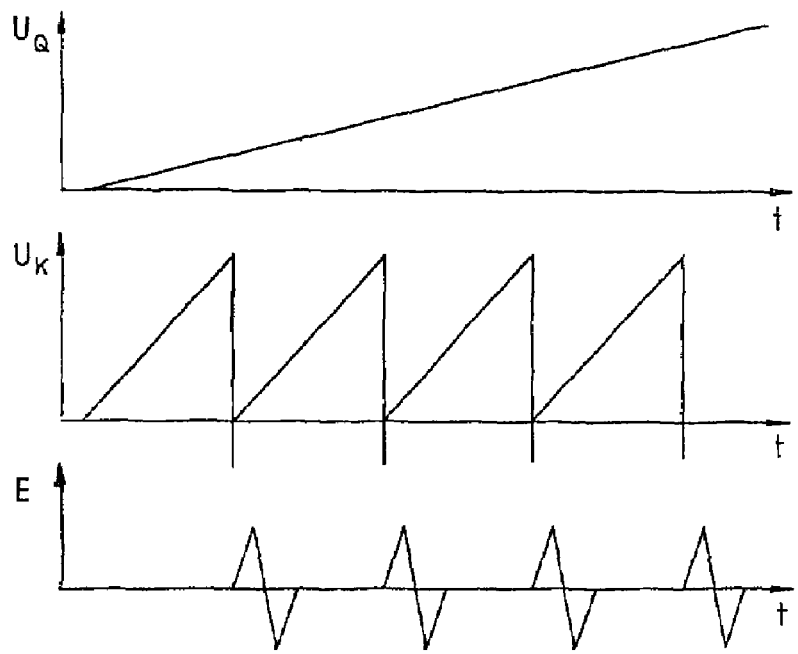
FIG. 3 shows an outline illustration of the voltage waveform and of the emitted microwave pulses when using a high-voltage switch according to the invention for a microwave generator.

FIG. 3 uses three graphs, although these do not show the actual voltage levels and voltage ratios with respect to one another (because they are in the form of an outline sketch), to show the voltage and pulse waveforms. The upper curve shows the voltage waveform of a single-shot high-voltage source, such as an explosion-powered high-voltage generator, across a large load capacitance. The voltage and thus the energy are transmitted in the form of a single pulse. The middle curve shows the voltage ratios on the charged capacitor structure. As can be seen, this structure is initially charged quickly, until the capacitor voltage reaches the breakdown voltage of the first spark gap, at which point a breakdown occurs, leading to discharging of the capacitor structure, and this is expressed in a steeply falling capacitor voltage. At the same time, as is in the lower curve, this results in emission of the microwave pulse that is produced as a result of the discharge. Immediately after the discharge, the capacitor structure is charged again because the voltage pulse produced by the high-voltage source is still present. When the breakdown voltage of the second spark gap is reached, this results in another breakdown, another discharge, and emission of a second microwave pulse, and so on. This continues until the high-voltage source either no longer charges the capacitor structure or all of the spark gaps have been triggered, and in consequence no more breakdowns are possible.

Figure 4:
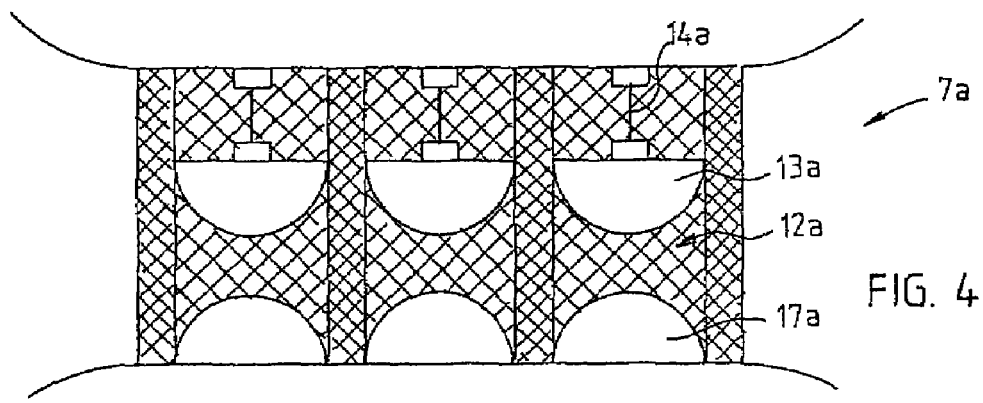
FIG. 4 shows an outline illustration of a second embodiment of a high-voltage switch according to the invention.

FIG. 4 shows, in the form of an outline sketch, a further embodiment of a high-voltage switch 7a according to the invention, but in which the electrodes 13a, 17a as well as the fuses 14a are completely encapsulated in insulating material, which at the same time forms the dielectric for the spark gaps 12a. However, the principle of operation is the same as that described with reference to the high-voltage switch 7 shown in FIG. 2.

Figure 5:
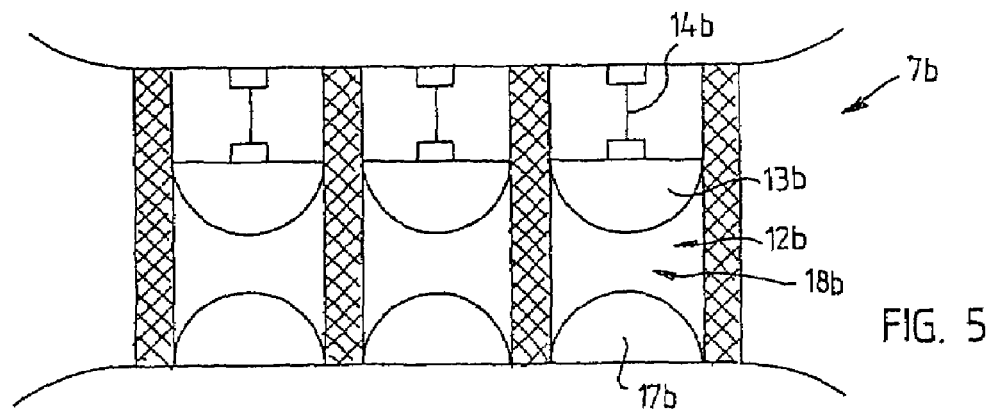
FIG. 5 shows an outline illustration of a third embodiment of a high-voltage switch according to the invention.

In contrast, FIG. 5 shows a third embodiment of a high-voltage switch 7b according to the invention. This corresponds essentially to the high-voltage switch 7 in FIG. 2, although a solid dielectric is not used there, but only a gaseous dielectric 18b in the spark gap 12b. It would also be feasible to use a liquid dielectric. These dielectrics admittedly have a self-healing capability, and thus a capability to restore the withstand voltage after a previous breakdown, but second triggering is not possible, because of the destruction of the respective fuse 14b. Since, however, further spark gaps 12b are available, further triggering can take place considerably more quickly.

As already described, the use of a high-voltage switch according to the invention is not restricted to the field of microwave generators. In fact, the high-voltage switch according to the invention can be used wherever high-energy pulses, in particular individual pulses, must be switched, for example in the field of driving and production of laser pulses.

The invention claimed is:

1. A high-voltage switch having a high-voltage source, the high-voltage switch comprising:
    a plurality of spark gaps each having two electrodes;
    a fuse being connected in series with each spark gap of the plurality of spark gaps forming series circuits, the series circuits being connected to one another in a parallel circuit, wherein each fuse is configured and dimensioned to blow after a triggering of its associated spark gap from the high-voltage source, which allows the triggering of another spark gap, thus allowing the discharge, in the form of a cascade, of a plurality of pulse elements across the spark gaps.

2. The high-voltage switch as claimed in claim 1, wherein at least one of the plurality of spark gaps has selectively a liquid or gaseous dielectric.

3. The high-voltage switch as claimed in claim 1, wherein at least one of the plurality of spark gaps is at least partially composed of a solid dielectric.

4. The high-voltage switch as claimed in claim 3, wherein in order to cascade voltage-dependent flashover times, each of the plurality of spark gaps have different lengths.

5. The high-voltage switch as claimed in claim 3, wherein when using solid dielectric, the thickness of each dielectric is different in the corresponding spark gap.

6. The high-voltage switch as claimed in claim 1, wherein the two electrodes of each of the plurality of spark gaps are positioned opposite one another and are separated from one another by the corresponding spark gap.

7. The high-voltage switch as claimed in claim 6, further comprising an isolator mount having a plurality of channels which are isolated from one another and in each of which at least one electrode and the corresponding fuse are accommodated.

8. The high-voltage switch as claimed in claim 1, wherein each fuse is a copper wire fuse.

9. The high-voltage switch as claimed in claim 8, wherein the copper wire fuse has a diameter of $\leqq 100$ μm and a length of $\leqq 15$ cm.

10. The high-voltage switch as claimed in claim 8, wherein the copper wire fuse has a diameter between 5 μm and 25 μm and a length between 5 cm and 10 cm.

11. The high-voltage switch as claimed in claim 1, wherein the spark gaps are selectively arranged in a row or a ring.

12. The high-voltage switch as claimed in claim 1, wherein the high-voltage switch is located in a microwave generator.

13. The high-voltage switch as claimed in claim 12, wherein the microwave generator has at least one charge store which is connected in series with an associated high-voltage switch, in which case the charge store is discharged via the respective high-voltage switch in order to emit microwaves.

\* \* \* \* \*